United States Patent
Gu et al.

(10) Patent No.: US 11,988,715 B2
(45) Date of Patent: May 21, 2024

(54) DEVICE FOR DIAGNOSING TURN-SHORT FAULT OF INDUCTION MOTOR AND METHOD THEREOF

(71) Applicant: Kyungpook National University Industry-Academic Cooperation Foundation, Daegu (KR)

(72) Inventors: Bon-Gwan Gu, Daegu (KR); Seong Hwan Im, Daegu (KR)

(73) Assignee: Kyungpook National University Industry-Academic Cooperation Foundation, Daegu (KR)

(*) Notice: Subject to any disclaimer, the term of this patent is extended or adjusted under 35 U.S.C. 154(b) by 312 days.

(21) Appl. No.: 17/536,430

(22) Filed: Nov. 29, 2021

(65) Prior Publication Data

US 2022/0137138 A1 May 5, 2022

Related U.S. Application Data

(63) Continuation of application No. PCT/KR2021/009430, filed on Jul. 21, 2021.

(30) Foreign Application Priority Data

Oct. 29, 2020 (KR) .......................... 10-2020-0142285

(51) Int. Cl.
*G01R 31/34* (2020.01)
*G01R 31/52* (2020.01)

(52) U.S. Cl.
CPC ........... *G01R 31/346* (2013.01); *G01R 31/52* (2020.01)

(58) Field of Classification Search
CPC .............................. G01R 31/346; G01R 31/52
See application file for complete search history.

(56) References Cited

U.S. PATENT DOCUMENTS

2014/0372091 A1* 12/2014 Larimore ................ G06F 30/20
                                                                   703/2
2018/0062553 A1*  3/2018 Van ......................... H02P 23/14

FOREIGN PATENT DOCUMENTS

| JP | 2008011622 A | | 1/2008 |
| JP | 2012186973 A | * | 9/2012 |
| JP | 2014504144 A | | 2/2014 |
| JP | 2014117141 A | | 6/2014 |
| JP | 2019176649 A | | 10/2019 |
| JP | JPWO2019202651 A | | 2/2021 |
| KR | 1020050063441 A | | 6/2005 |
| KR | 10-2007-0049460 A | | 11/2007 |
| KR | 10-0786229 B | | 12/2007 |

(Continued)

OTHER PUBLICATIONS

Korean Office Action for Application No. 021802159 dated Mar. 22, 2022.

(Continued)

*Primary Examiner* — Scott Bauer
(74) *Attorney, Agent, or Firm* — KDW Firm PLLC

(57) ABSTRACT

A device for diagnosing a turn-short fault of an induction motor, the device including an induction motor; and a fault detecting unit to detect a current flowing in a supply line that supplies power to an input terminal of the induction motor and diagnose whether the induction motor has a fault, in which the fault detecting unit diagnoses whether the induction motor has the fault by applying a dynamic model. A method thereof is also disclosed.

11 Claims, 4 Drawing Sheets

(56) References Cited

FOREIGN PATENT DOCUMENTS

| KR | 10-0925148 B1 | 11/2009 |
|----|---------------|---------|
| KR | 10-1169797 B  | 7/2012  |
| KR | 101348635 B1  | 1/2014  |
| KR | 10-1357827 B  | 5/2014  |
| KR | 10-1357828 B  | 5/2014  |
| KR | 10-1735159 B1 | 5/2017  |
| KR | 10-2040397 B1 | 11/2019 |
| WO | 2019202651 A  | 10/2019 |

OTHER PUBLICATIONS

Seong-Hwan, Im, et al, "Study of Dynamic Model of Induction Motor with Inter-turn Short Fault," The Transactions of the Korean Institute of Electrical Engineers, vol. 69, No. 8, pp. 1193-1199, 2020.

Korean Office Action for Application No. 20200142285 dated Nov. 24, 2022.

Woo et al, "Analysis of 3-phase Squirrel Cage Induction Motor with Mixed Fault," Proceedings of KIEE Conference, Jul. 2009, pp. 698-699.

Korean Search Report for Application No. PCT/KR2021/009430 dated Feb. 11, 2022.

\* cited by examiner

DEVICE FOR DIAGNOSING TURN-SHORT FAULT OF INDUCTION MOTOR AND METHOD THEREOF

CROSS-REFERENCE TO RELATED APPLICATIONS

This application is a continuation application from and claims priority to International Patent Application No. PCT/KR2021/009430, filed on Jul. 21, 2021, which claims priority to Korean patent application No. 10-2020-0142285 filed on Oct. 29, 2020, the disclosures of both of which are incorporated by reference herein in their entireties.

GOVERNMENT INTEREST

This work was partly supported by the KEIT Technology Innovation Program, (20011387, "Development of 50 kW vertical multistage smart fire pump system") funded by the Ministry of Trade, Industry & Energy (MOTIE, Korea) and by Basic Science Research Program through the National Research Foundation of Korea (NRF) funded by the Ministry of Education (No. 2020R1I1A3A04036842).

TECHNICAL FIELD

The present invention relates to a device for diagnosing a turn-short fault of an induction motor, and a method thereof.

BACKGROUND

Currently, an induction motor is being used in various industrial fields because of advantages of its strong mechanical properties, low price, and constant speed operation without an inverter. The induction motor is formed of various mechanical components, such as coils, rotor bars, and bearings, and each of the components has the potential to cause a fault. In particular, among the components, the most frequent faults occur in wound coils.

In a stator, a coil coated with an insulator on the outer circumferential surface of a copper wire is wound multiple times. The insulator coated on the coil easily loses its insulating properties due to various factors, such as heat, vibration, and the like generated when the motor is driven. The coil that has lost the insulating properties is in contact with the adjacent coil to form a closed circuit network, and induced electromotive force is generated by the linked magnetic flux induced in the formed closed circuit. Such a fault refers to a turn-short fault.

Since the closed circuit formed by the turn-short fault has very small impedance, a fault current larger than the rated current flows inside the closed circuit even when low induced electromotive force occurs. The induced large fault current causes extreme heat generation inside the induced electromotive force, which weakens the insulating property of the coil wound around the fault coil and causes an increase in the turn-short fault.

If such a turn-short fault is not diagnosed and responded to at an early stage, there is a problem in that a risk due to fire that may occur in the coil, an additional risk due to damage to the motor, and financial damage occur.

In order to diagnose a fault of the induction motor, the Motor Current Signal Analysis (MCSA) and the Stary Flux Signature Analysis (SFSA) have been proposed.

The MCSA is the method of diagnosing a fault through an abnormal ingredient of a current flowing in a stator of the induction motor, and requires the large amount of prior experimental data for the fault diagnosis. The SFSA is the method of diagnosing a fault by monitoring a magnetic flux generated in an induction motor by using a magnetic flux sensor, and requires the large amount of prior experimental data.

That is, the method of diagnosing the fault of the induction motor used in the related art causes artificial faults in an induction motor for prior experiments, accumulates data through the prior experiments, and determines whether the induction motor has a fault based on the accumulated data.

However, in the case of the fault diagnosis method of the induction motor that requires prior experimental data, there is a problem in that the time and cost required to accumulate additional prior experimental data are enormous, and the data accumulated by the experiments cannot include all of the various fault phenomena incurable in the induction motor. In this case, there is a problem in that it is impossible to diagnose and response to the turn-short fault at an early stage, and there is a problem in that a fire risk, a risk of motor damage, and financial damage are generated according to the fault to the early diagnosis and response.

SUMMARY

The present invention provides a device for a diagnosing a turn-short fault of an induction motor which does not require prior experimental data, and a method thereof.

The present invention discloses a device for diagnosing a turn-short fault of an induction motor.

The device for diagnosing a turn-short fault of an induction motor according to the present invention includes: an induction motor; and a fault detecting unit configured to detect a current flowing in a supply line that supplies power to an input terminal of the induction motor and diagnose whether the induction motor has a fault, in which the fault detecting unit diagnoses whether the induction motor has the fault by applying a dynamic model.

According to an exemplary embodiment, the fault detecting unit may diagnose whether the induction motor has the fault by comparing a first reverse phase component current in which a current provided to the induction motor is reversely converted with a second reverse phase component current obtained by applying the dynamic model.

According to an exemplary embodiment, when the first reverse phase component current is the same as the second reverse phase component current, the fault detecting unit may diagnose that the induction motor has the fault.

According to an exemplary embodiment, when the first reverse phase component current is larger than the second reverse phase component current, the fault detecting unit may increase a degree of fault of the second reverse phase component current until when the first reverse phase component current is the same as the second reverse phase component current.

According to an exemplary embodiment, the dynamic model may be defined through a following equation.

$$V_{ITF\ model} = R_{[11 \times 11]} I_{ITF\ model} + d/dl(L_{[11 \times 11]} I_{ITF\ model})$$

$$V_{ITF\ model} = [v_{ds}^s\ v_{qs}^s\ v_f\ v_{dr1}^s\ v_{dr2}^s\ v_{dr3}^s\ v_{dr4}^s\ v_{qr1}^s\ v_{qr2}^s\ v_{qr3}^s\ v_{qr4}^s]^T$$

$$I_{ITF\ model} = [i_{ds}^s\ i_{qs}^s\ i_f\ i_{dr1}^s\ i_{dr2}^s\ i_{dr3}^s\ i_{dr4}^s\ i_{qr1}^s\ i_{qr2}^s\ i_{qr3}^s\ v_{qr4}^s]^T \quad \text{Equation}$$

According to an exemplary embodiment, the fault detecting unit may include: a current detecting unit which detects the current flowing in the supply line; a converting unit which converts the current detected in the current detecting unit into the first reverse phase component current; a calculating unit which calculates the second reverse phase component current; and a determining unit which diagnoses whether the induction motor has the fault by comparing the first reverse phase component current with the second reverse phase component current.

According to an exemplary embodiment, the dynamic model may be applied to the calculating unit of the fault detecting unit.

According to an exemplary embodiment, the second reverse phase component current may represent a fault occurring by a virtual induction motor.

The present invention discloses a method of diagnosing a turn-short fault of an induction motor.

The method of diagnosing a turn-short fault of an induction motor includes: detecting a current provided to an induction motor; converting the current detected from the induction motor into a first reverse phase component current; calculating a second reverse phase component current from a virtual induction motor; and determining whether the induction motor has the fault by comparing the first reverse phase component current and the second reverse phase component current.

According to an exemplary embodiment, the determining whether the induction motor has the fault may include diagnosing that the induction motor has a turn-short fault when the first reverse phase component current is the same as the second reverse phase component current.

According to the exemplary embodiment, the method may further include when the first reverse phase component current is larger than the second reverse phase component current, increasing a degree of fault of the second reverse phase component current until when the first reverse phase component current is the same as the second reverse phase component current.

According to the exemplary embodiment, the second reverse phase component current may be obtained through a dynamic model, and the dynamic model may include a following equation.

$$V_{ITF\,model} = R_{[11 \times 11]} \cdot I_{ITF\,model} + \frac{d}{dt}(L_{[11 \times 11]} \cdot I_{ITF\,model}) \quad \text{Equation}$$

$$V_{ITF\,model} =$$

$$[v_{ds}^2 \; v_{qs}^s \; v_f \; v_{dr1}^s \; v_{dr2}^s \; v_{dr3}^s \; v_{dr4}^s \; v_{qr1}^s \; v_{qr2}^s \; v_{qr3}^s \; v_{qr4}^s]^T$$

$$I_{ITF\,model} =$$

$$[i_{ds}^2 \; i_{qs}^s \; i_f \; i_{dr1}^s \; i_{dr2}^s \; i_{dr3}^s \; i_{dr4}^s \; i_{qr1}^s \; i_{qr2}^s \; i_{qr3}^s \; i_{qr4}^s]^T$$

Advantageous Effects

The present invention may provide the device for diagnosing the turn-short fault of the induction motor which is capable of determining a fault without prior experimental data, and the method thereof.

DETAILED DESCRIPTION

Figure 1:
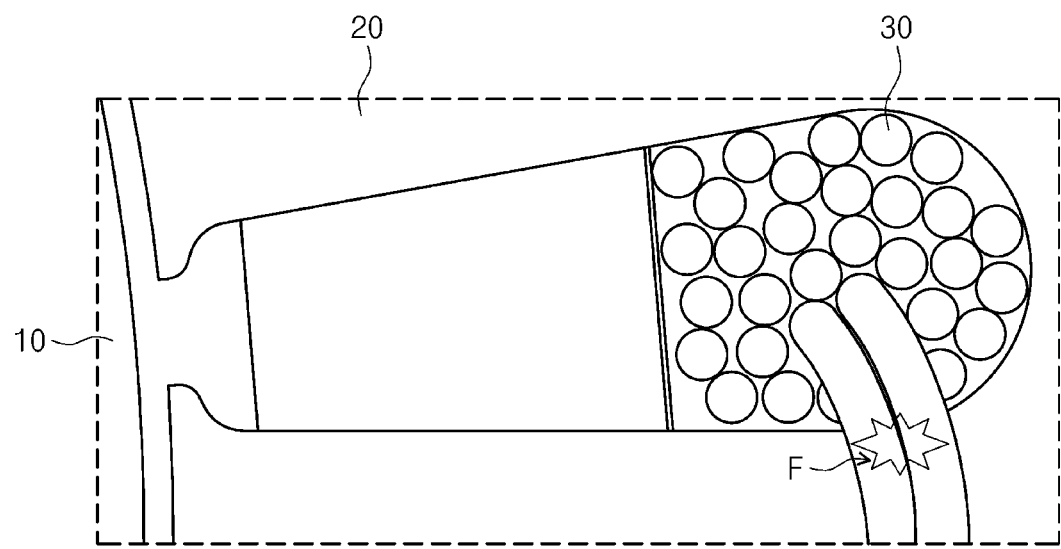
FIG. 1 is a diagram visually illustrating a turn-short fault.

Terms used in the present specification and the accompanying drawings are for easy explanation of the present invention, so that the present invention is not limited by the terms and the drawings.

A detailed description of known techniques that are not closely related to the spirit of the present invention among the technologies used in the present invention will be omitted.

Hereinafter, preferable embodiments according to embodiments of the present invention will be described with reference to accompanying drawings so as to be easily understood by a person ordinary skilled in the art. However, the present invention can be variously implemented and is not limited to the following embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Terms including an ordinal number, such as a first and a second, may be used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

Singular expressions used herein include plurals expressions unless they have definitely opposite meanings in the context. Accordingly, shapes, sizes, and the like of the elements in the drawing may be exaggerated for clearer description.

The term "~ unit" used in the present specification is a unit for processing at least one function or operation, and may mean, for example, a hardware element, such as an FPGA or an ASIC. However, the "~ unit" is not limited to software or hardware. The "~ unit" may also be configured to be included in an addressable storage medium, and may be configured to reproduce one or more processors.

As an example, the "~ unit" includes components, such as software components, object-oriented software components, class components, and task components, and processes, functions, attributes, procedures, subroutines, segments of a program code, drivers, firmware, micro-codes, circuits, data, database, data structures, tables, arrays, and variables. Functions provided by the constituent element, "~ unit", and "~ module" may also be separately performed by the plurality of constituent elements, "~ units", and "~ modules", and may also be combined with other additional constituent elements.

A device for diagnosing a turn-short fault of an induction motor according to the present invention may be a fault diagnosis device used in an induction motor. The device for diagnosing the turn-short fault of the induction motor according to the present invention may be a fault diagnosis device used in an industrial driving system, an industrial motor, and the like. The device for diagnosing the turn-short fault of the induction motor according to the present invention may be a fault diagnosis device used in a vehicle, an electric vehicle, an eco-friendly vehicle, and the like. The device for diagnosing the turn-short fault of the induction motor according to the present invention may be a fault diagnosis device used in a motor for a vehicle, a motor for an electric vehicle, a motor for an eco-friendly vehicle, and the like. However, the present invention is not limited thereto, and may be applied to various fields in which the induction motor is used.

The device for diagnosing the turn-short fault of the induction motor according to the present invention will be described based on a turn-short fault occurring in a three-phase induction motor as an example. However, the present invention is not limited thereto, and is applicable to a motor operating in an alternating current. For example, the present invention may be applied to the induction motor. For example, the present invention may be applied to at least one of a single-phase induction motor, a squirrel-cage induction motor, and a winding type induction motor.

FIG. 1 is a diagram visually illustrating a turn-short fault.

Referring to FIG. 1, the induction motor may include a shaft (not illustrated), a rotor 10 coupled to the shaft and rotating together with the shaft, a stator 20 disposed at the external side of the rotor 10, and a plurality of coils 30 wound around a slot of the stator 20. The rotor 10 may be referred to as a rotor and the stator 20 may be referred to as a stator.

The coil 30 of the induction motor may be formed of a copper wire coated with a thin insulator. The coil 30 of the induction motor easily loses insulating properties due to stress, aging of the insulator, and the like by vibration according to the driving of the motor and high-voltage and high-current flowing in the coil 30. In this case, short-circuit may occur between the adjacent coils 30, and the short-circuit refers to a turn-short fault F.

When the turn-short fault F occurs, a closed circuit is formed between the windings by the shorted coils 30, and an induced electromotive force is generated by the amount of change in the linked magnetic flux in the formed closed circuit. The formed closed circuit has low resistance, so that a high current flows inside the closed circuit, and heat is generated inside the induction motor due to the high current. The heat generated in the closed circuit of the induction motor weakens the insulator of the adjacent coil 30 to increase the turn-short fault F. Accordingly, it is necessary to diagnose and responds to the turn-short fault F at an early stage. Further, online fault diagnosis is required to reduce idle costs and prevent fire.

The device for diagnosing the turn-short fault of the induction motor and the method thereof according to the present invention are capable of diagnosing a turn-short fault without accumulation of prior data in order to solve the foregoing problems.

Hereinafter, the device for diagnosing the turn-short fault of the induction motor and the method thereof according to the present invention will be described in detail with reference to the drawings.

Figure 2:
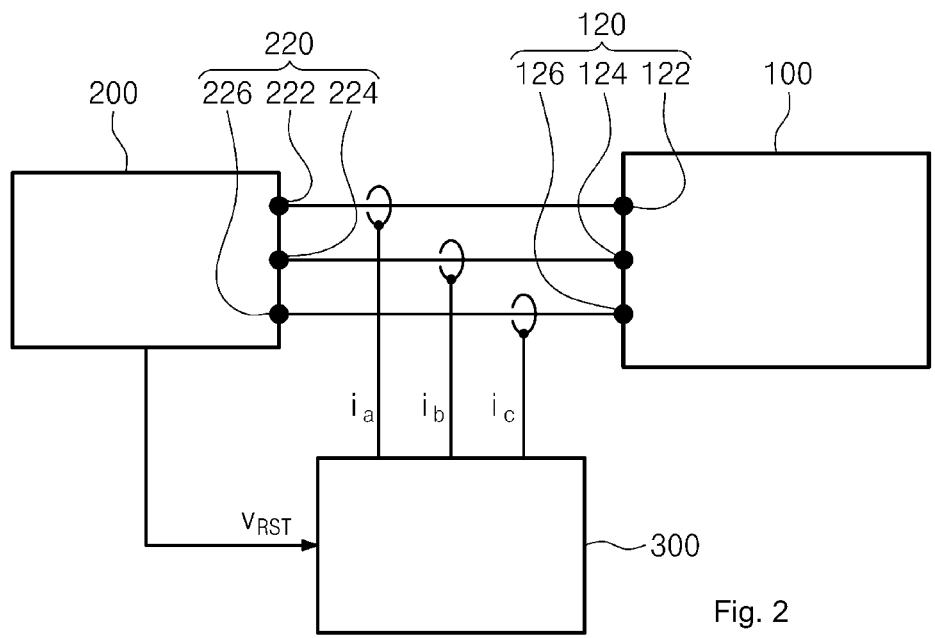
FIG. 2 is a configuration diagram illustrating a device for diagnosing a fault of a device for diagnosing a turn-short fault of an induction motor and a method thereof according to the present invention.
Figure 3:
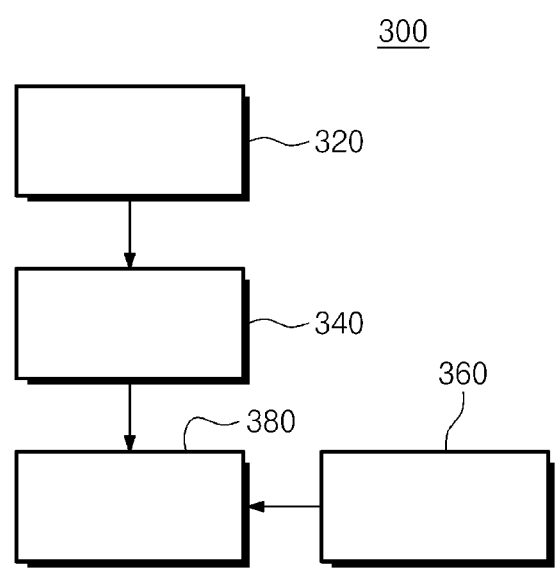
FIG. 3 is a diagram illustrating a fault detecting unit of FIG. 2.
Figure 4:
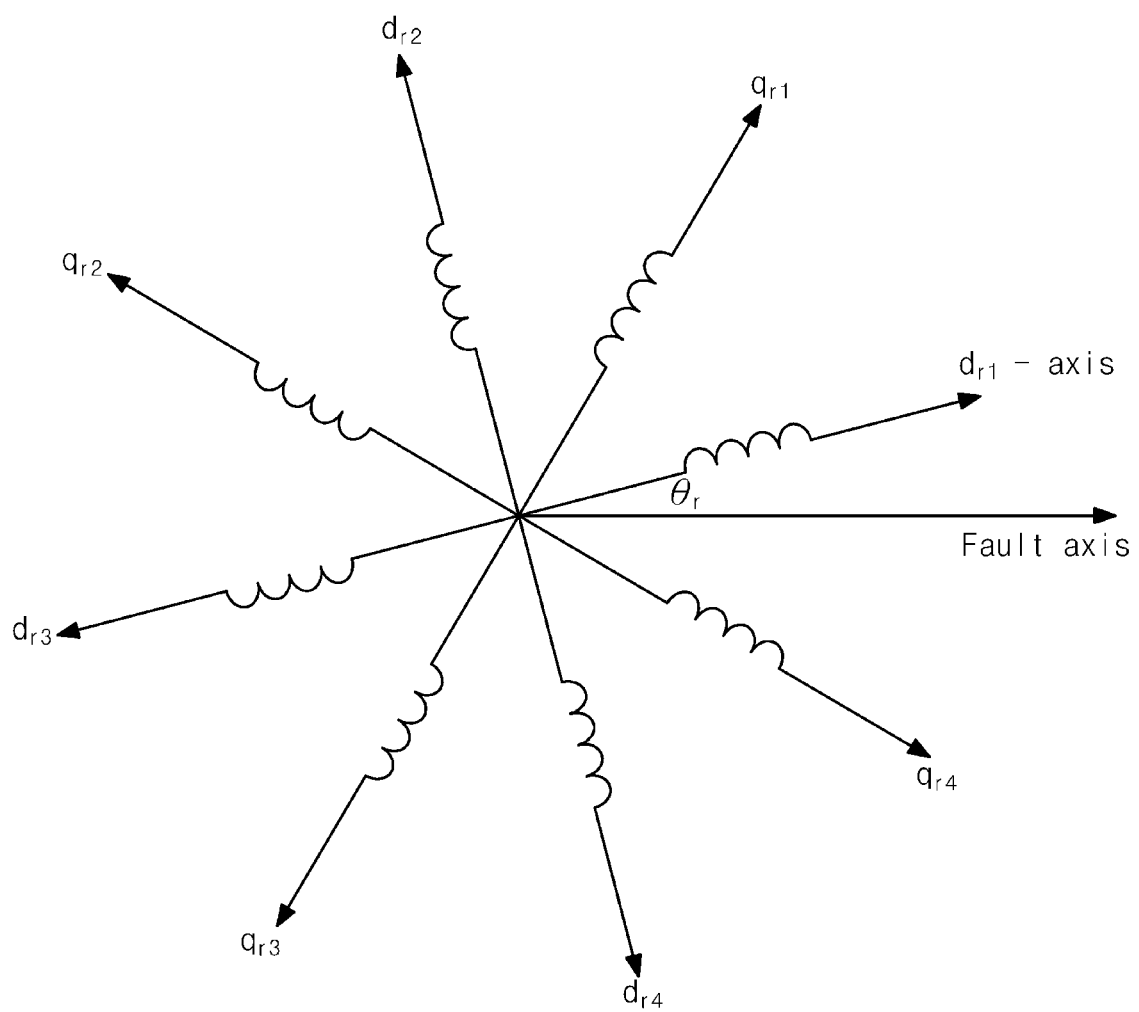
FIG. 4 is a diagram illustrating axes of a rotor of the induction motor used in the device for diagnosing the turn-short fault of the induction motor and the method thereof according to the present invention.
Figure 5:
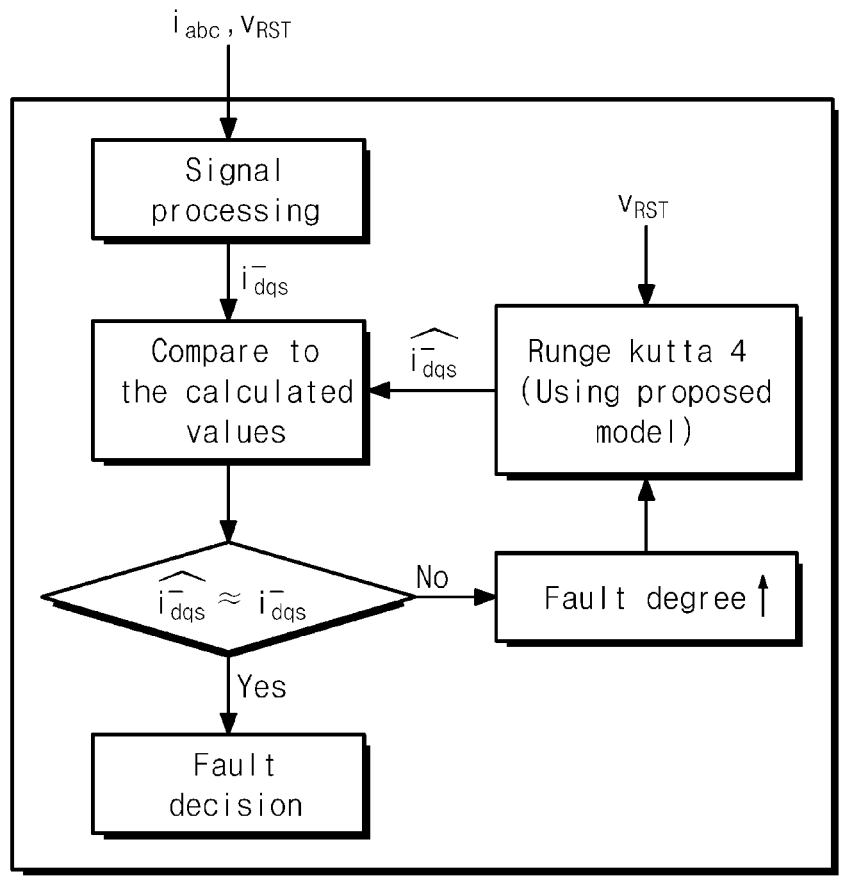
FIG. 5 is a diagram illustrating a fault diagnosis algorithm according to the device for diagnosing the turn-short fault of the induction motor and the method thereof of the present invention.
Figure 6:
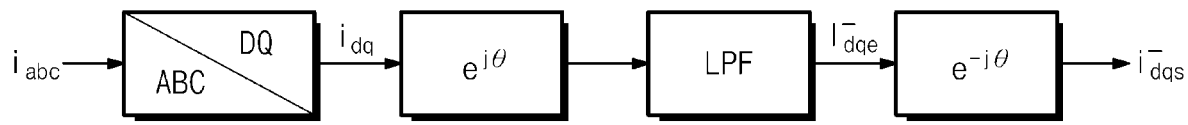
FIG. 6 is a diagram illustrating a signal processing process of a reverse phase component current of the device for diagnosing the turn-short fault of the induction motor and the method thereof according to the present invention.

FIG. 2 is a configuration diagram illustrating the device for diagnosing the fault of the device for diagnosing the turn-short fault of the induction motor and the method thereof according to the present invention, FIG. 3 is a diagram illustrating a fault detecting unit of FIG. 2, FIG. 4 is a diagram illustrating the axes of the rotor of the induction motor used in the device for diagnosing the turn-short fault of the induction motor and the method thereof according to the present invention, FIG. 5 is a diagram illustrating a fault diagnosis algorithm according to the device for diagnosing the turn-short fault of the induction motor and the method thereof of the present invention, and FIG. 6 is a diagram illustrating a signal processing process of a reverse phase component current of the device for diagnosing the turn-short fault of the induction motor and the method thereof according to the present invention.

Referring to FIGS. 2 and 3, the device for diagnosing the turn-short fault of the induction motor and the method thereof according to the present invention may include an induction motor 100, a power supply unit 200, and a fault detecting unit 300. However, the present invention is not limited thereto, and may be implemented except for some of these configurations.

The induction motor 100 will be described using a three-phase induction motor as an example. Herein, the three phases are defined as phase a, phase b, and phase c. The induction motor 100 may receive power from the power supply unit 200. The induction motor 100 may receive three alternating current power having different phases. The induction motor 100 may include an input terminal 120 receiving power from the power supply unit 200. The input unit 120 may include a plurality of input terminals. Hereinafter, the present invention will be described based on the case where three input terminals are included. This is because the three-phase induction motor is described as an example, and in the case of a single-phase induction motor, one input terminal may be included. That is, the number of input terminals 120 may be changed according to the type of 100. The plurality of input terminals 122, 124, and 126 may include a first input terminal 122, a second input terminal 124, and a third input terminal 126. The induction motor 100 may receive power of phase a through a supply line connected with the first input terminal 122. The induction motor 100 may receive power of phase b through a supply line connected with the second input terminal 124. The induction motor 100 may receive power of phase c through a supply line connected with the second input terminal 124. When the induction motor 100 receives the alternating-current power, a rotating magnetic field may be formed in the stator of the induction motor 100. The rotor of the induction motor 100 may receive the rotating magnetic field, so that an induced electromotive force may be formed. In this case, the electromotive force is received and a current flows in the rotor, and magnetic force may be formed with the current in the rotor. Torque is generated through an interaction between the magnetic force of the rotor and the magnetic field of the stator, so that the induction motor 100 may be driven.

The power supply unit 200 may supply power to the induction motor 100. The power supply unit 200 may be a three-phase voltage source. This is because the induction motor 100 is described as the three-phase induction motor, so that the power supply unit may include an appropriate voltage source according to the type of induction motor 100. The power supply unit 200 may include an output terminal 220. The output terminal 220 may correspond to the number of input terminals 120 of the 10. The output terminal 220 of the power supply unit 220 may include a plurality of output terminals 220. The plurality of output terminals 220 may include first to third output terminals 222, 224, and 226. The power supply unit 200 may supply the power of phase a to the induction motor 100 through the first output terminal 222. The power supply unit 200 may supply the power of phase b to the induction motor 100 through the second output terminal 224. The power supply unit 200 may supply the power of phase c to the induction motor 100 through the third output terminal 226. The first output terminal 222 may be connected with the first input terminal 122 through the supply line. The second output terminal 224 may be connected with the second input terminal 124 through the supply line. The third output terminal 226 may be connected with the third input terminal 126 through the supply line.

The fault detecting unit 300 may detect whether the induction motor 100 has a fault. The fault detecting unit 300 may be installed between the induction motor 100 and the power supply unit 200. The fault detecting unit 300 may be installed on the supply line between the induction motor 100 and the power supply unit. The fault detecting unit 300 may sense the three-phase current ($i_{abc}$) supplied to the induction motor 100 in real time. The fault detecting unit 300 may determine whether the induction motor 100 has a fault by sensing the three-phase current ($i_{abc}$) supplied to the induction motor 100. The fault detecting unit 300 may convert the sensed three-phase current ($i_{abc}$) into a reverse phase component current ($i^-_{dqs}$) of two axes, and determine whether the induction motor 100 has a fault through the converted reverse phase component current ($i^-_{dqs}$). Hereinafter, two axes refer to the d-axis and the q-axis.

Referring to FIG. 3, the fault detecting unit 300 may include a current detecting unit 320, a converting unit 340, a calculating unit 360, and a determining unit 380. However, the present invention may be implemented except for some of the configurations.

The current detecting unit 320 may be connected onto the supply line between the induction motor 100 and the power supply unit 200. The current detecting unit 320 may be connected to each of three supply lines between the induction motor 100 and the power supply unit 200 to sense the three-phase current ($i_{abc}$). In the current detecting unit 320, various current detecting probes, such as a current transformer, may be applied to a detecting terminal for detecting the current flowing in the supply line.

The converting unit 340 may reversely convert the three-phase current ($i_{abc}$) sensed in the current detecting unit 320. The converting unit 340 may convert the three-phase current ($i_{abc}$) sensed in the current detecting unit 320 to the reverse phase component current ($i^-_{dqs}$). Hereinafter, the reverse phase component current ($i^-_{dqs}$) converted from the three-phase current ($i_{abc}$) sensed in the current detecting unit 320 is referred to as a first reverse phase component current.

FIG. 6 represents a process for converting the three-phase current ($i_{abc}$) into the first reverse phase component current in the converting unit 340. Referring to FIG. 6, the sensed three-phase current ($i_{abc}$) is first converted into a coordinate system of the d-axis and the q-axis and is converted to a two-axis current ($i_{dq}$). The converted two-axis current ($i_{dq}$) is converted into a reverse phase coordinate system, and then passes through a Low Pass Filter (LPF) for filtering a component other than the reverse phase component. The reverse phase coordinate system current ($I^-_{dqs}$) passing through the LPF is converted into a stationary coordinate system and is converted to a first reverse phase component current ($i^-_{dqs}$). The present invention may diagnose whether the induction motor 100 has a fault by using the first reverse phase component current ($i^-_{dqs}$).

The calculating unit 360 may generate a second reverse phase component current ($\widehat{i_{dqs}}$) by applying a dynamic model. The calculating unit 360 may calculate the second reverse phase component current ($\widehat{i_{dqs}}$) by driving a virtual induction motor. The calculating unit 360 may calculate a virtual second reverse phase component current ($\widehat{i_{dqs}}$) in real time by applying the dynamic model to the Runge kutta 4th method. The calculating unit 360 may be, for example, a CPU. The dynamic model may be, for example, a program or software. That is, the calculating unit 360 that is the CPU drives the virtual induction motor, and may calculate the current value received from the virtual induction motor as the second reverse phase component current ($\widehat{i_{dqs}}$) through the dynamic model. In this case, the calculating unit 360 may calculate a second reverse phase component current ($\widehat{i_{dqs}}$) by applying the dynamic model to the Runge kutta 4th method.

The dynamic model may be defined by a following equation. The dynamic model according to the present invention is described based on a four-pole induction motor as an example. FIG. 4 is a diagram in which the d-axis and the q-axis of the rotor according to the four-pole induction motor are divided and expressed so as to be in proportion to the number of poles. When the turn-short fault occurs in the stator winding, the influence of the fault on the rotor may vary depending on the faulty winding and the position of the axis of each of the rotors. Accordingly, as illustrated in FIG. 4, for the dynamic model according to the present invention, the d-axis and the q-axis of the rotor according to the induction motor are divided so as to be in proportion to the number of poles, and the dynamic model is set based on the component of each divided axis.

$$V_{ITF\ model} = R_{[11\times11]} \cdot I_{ITF\ model} + \frac{d}{dt}(L_{[11\times11]} \cdot I_{ITF\ model}) \quad \langle\text{Equation}\rangle$$

$$V_{ITF\ model} = [v^s_{ds}\ v^s_{qs}\ v_f\ v^s_{dr1}\ v^s_{dr2}\ v^s_{dr3}\ v^s_{dr4}\ v^s_{qr1}\ v^s_{qr2}\ v^s_{qr3}\ v^s_{qr4}]^T$$

$$I_{ITF\ model} = [i^s_{ds}\ i^s_{qs}\ i_f\ i^s_{dr1}\ i^s_{dr2}\ i^s_{dr3}\ i^s_{dr4}\ i^s_{qr1}\ i^s_{qr2}\ i^s_{qr3}\ i^s_{qr4}]^T$$

Herein, $v^s_{ds}$ and $v^s_{qs}$ are the d-axis voltage and the q-axis voltage supplied to the stator, respectively, $v_f$ is a faulty circuit voltage, and $v^s_{dr1}$, $v^s_{dr2}$, $v^s_{dr3}$, $v^s_{dr4}$, $v^s_{qr1}$, $v^s_{qr2}$, $v^s_{qr3}$, and $v^s_{qr4}$ are the d-axis currents and the q-axis currents applied to the rotor. $R_{[11\times11]}$ is a resistance value of the respective coils, and $L_{[11\times11]}$ is inductance of the respective coils. $V_{ITFmodel}$ and $I_{ITFmodel}$ are as follows.

$R_{[11\times11]}$ and $L_{[11\times11]}$ may be calculated through a finite element analysis method.

The determining unit 380 may determine whether the induction motor 100 has the turn-short fault by comparing the first reverse phase component current received from the converting unit 340 with the second reverse phase component current received from the calculating unit 360. Referring to FIG. 5, the determining unit 380 diagnoses that the induction motor 100 has the turn-short fault when the first reverse phase component current is equal or almost similar to the second reverse phase component current. In the case of the three-phase induction motor, each axis is balanced, and when the turn-short fault occurs, the balance between the faulty axis and the remaining axes is broken. That is, a high current flows in the fault axis and a low current flows in the two axes in which the fault does not occur, so that the reverse phase component is generated. In this case, a reference value for determining that the turn-short fault has occurred is required, and in the case of the existing fault diagnosis method, the fault is determined through the comparison with the accumulated data through the prior experiments. However, according to the present invention, the reference of the fault diagnosis is approached mathematically, so that it is possible to immediately determine whether a fault occurs without the prior experimental data.

Referring back to FIG. 5, when the first reverse phase current is larger than the second reverse phase component current, the determining unit 380 may transmit a signal to the calculating unit 360 so as to increase the degree of fault of the second reverse phase component current until the first reverse phase component current is equal to the second reverse phase component current. The calculating unit 360 may increase the degree of fault of the virtual induction motor according to the signal of the determining unit 380. The calculating unit 360 may calculate the second reverse phase component current of which the degree of fault is increased based on the current received from the virtual induction motor in which the degree of fault is increased. When the second reverse phase component current in which the degree of fault is increased is equal to the first reverse phase component current, the determining unit 380 does not increase the degree of fault any more, and may finally detect the fault state in this state and diagnose that the induction motor 100 has the turn-short fault.

Hereinafter, the method of diagnosing the turn-short fault of the induction motor according to the present invention will be described.

The method of diagnosing the turn-short fault of the induction motor may include: detecting a current supplied to the induction motor 100; converting the current detected from the induction motor 100 into a first reverse phase component current; calculating a second reverse phase component current from a virtual induction motor; and determining whether the induction motor 100 has a fault by comparing the first reverse phase component current and the second reverse phase component current. In the determining whether the induction motor 100 has the fault, when the first reverse phase component current is the same as the second reverse phase component current, it may be diagnosed that the induction motor has a turn-short fault. The method may further include, when the first reverse phase component current is larger than the second reverse phase component current, increasing the degree of fault of the second reverse phase component current until the first reverse phase component current is the same as the second reverse phase component current. The second reverse phase component current may be obtained through the foregoing dynamic model.

The present invention may provide the device for diagnosing the turn-short fault of the induction motor which is capable of determining a fault without prior experimental data, and the method thereof.

Further, in the case of the fault diagnosis method of the induction motor that requires prior experimental data, there is a problem in that the time and cost required to accumulate additional prior experimental data are enormous, and the device and the method of diagnosing the turn-short fault of the induction motor according to the present invention approach the reference of the fault diagnosis mathematically, so that it is possible to immediately determine whether a fault occurs without the prior experimental data. Further, the data accumulated by the experiments cannot include all of the various fault phenomena incurable in the induction motor, but the device and the method of diagnosing the turn-short fault of the induction motor according to the present invention may diagnose the turn-short fault that may occur in the induction motor. Through this, it is possible to diagnose and respond to the turn-short fault at an early stage, thereby preventing a fire risk, a risk of motor damage, and financial damage.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The technical scope of the present invention will be defined by the technical spirit of the accompanying claims, and it should be understood that the technical sprit of the present invention is not limited to the literal description of the claims itself, but substantially extends to the invention of an equivalent scope of the technical value.

The device described above may be implemented by a hardware component, a software component, and/or a combination of a hardware component, a software component. For example, the device and the constituent elements described in the exemplary embodiments may be implemented by using one or more general-purpose computers or special purpose computers, such as a processor, a controller, an Arithmetic Logic Unit (ALU), a digital signal processor, a microcomputer, a Field Programmable Array (FPA), a Programmable Logic Unit (PLU), a microprocessor, or any other device capable of executing and responding to instructions. The processing device may execute an Operating System (OS) and one or more software applications executed on the OS. Further, the processing device may also access, store, manipulate, process, and generate data in response to the execution of the software. For the convenience of the understanding, although one processing device is described as being used, those skilled in the art will recognize that the processing device may include a plurality of processing elements and/or multiple types of processing elements. For example, the processing device may include a plurality of processors or one processor and one controller. Further, other processing configuration, such as a parallel processor, is available.

The method according to the exemplary embodiment may be implemented in the form of a program instruction that can be executed through various computer means and recorded in a computer readable medium. The computer readable medium may include a program command, a data file, a data structure, and the like alone or in combination. The program command recorded in the medium may be specially designed and configured for the present invention, or may be publicly known to and used by those skilled in the computer software field. Examples of the computer readable recording medium include a magnetic medium, such as a hard disk, a floppy disk, or a magnetic tape, an optical recording medium, such as a CD-ROM or a DVD, a magneto-optical medium, such as a floptical disk, and a hardware device which is specifically configured to store and execute the program command such as a ROM, a RAM, and a flash memory. An example of the program command includes a high-level language code executable by a computer by using an interpreter, and the like, as well as a machine language code created by a compiler. The hardware device may be configured to operate as one or more software modules for performing the operations of the exemplary embodiment, and the reverse case is also similar.

While this invention has been described in connection with the limited exemplary embodiments, but various changes and modifications are possible based on the descriptions by those skilled in the art. For example, even though the described technologies are performed in an order different from the described method, and/or the described components of the system, the structure, the apparatus, the circuit, and the like may be combined in a different form from the described method or replaced or substituted by other constituent elements or equivalents, the appropriate result may be achieved.

Therefore, other implementations, other exemplary embodiments, and equivalents to the claims also belong to the scope of the following claims.

The invention claimed is:

1. A device for diagnosing a turn-short fault of an induction motor, the device comprising:
   an induction motor; and
   a fault detecting unit configured to detect a current flowing in a supply line that supplies power to an input terminal of the induction motor and diagnose whether the induction motor has a fault,
   wherein the fault detecting unit is configured to diagnose whether the induction motor has the fault by comparing a first reverse phase component current in which a current provided to the induction motor is reversely converted with a second reverse phase component current obtained by applying a dynamic model.

2. The device of claim 1, wherein when the first reverse phase component current is a same as the second reverse phase component current, the fault detecting unit is configured to diagnose that the induction motor has the fault.

3. The device of claim 1, wherein when the first reverse phase component current is larger than the second reverse phase component current, the fault detecting unit is configured to increase a degree of fault of the second reverse phase component current until when the first reverse phase component current is a same as the second reverse phase component current.

4. The device of claim 1, wherein the fault detecting unit includes:
   a current detecting unit configured to detect the current flowing in the supply line;
   a converting unit configured to convert the current detected in the current detecting unit into the first reverse phase component current;
   a calculating unit configured to calculate the second reverse phase component current; and
   a determining unit configured to diagnose whether the induction motor has the fault by comparing the first reverse phase component current with the second reverse phase component current.

5. The device of claim 4, wherein the dynamic model is applied to the calculating unit of the fault detecting unit.

6. The device of claim 1, wherein the second reverse phase component current represents a fault occurring by a virtual induction motor.

7. A device for diagnosing a turn-short fault of an induction motor, the device comprising:
   an induction motor; and
   a fault detecting unit configured to detect a current flowing in a supply line that supplies power to an input terminal of the induction motor and diagnose whether the induction motor has a fault, wherein the fault detecting unit is configured to diagnose whether the induction motor has a fault by applying a dynamic model,
   wherein the dynamic model is defined through a following equation.

$$V_{ITF\ model} - R_{[11\times11]} \cdot I_{ITF\ model} + \frac{d}{dt}(L_{[11\times11]} \cdot I_{ITF\ model}) \quad \text{Equation}$$

$$V_{ITF\ model} = [v_{ds}^2\ v_{qs}^s\ v_f\ v_{dr1}^s\ v_{dr2}^s\ v_{dr3}^s\ v_{dr4}^s\ v_{qr1}^s\ v_{qr2}^s\ v_{qr3}^s\ v_{qr4}^s]^T$$

$$I_{ITF\ model} = [i_{ds}^2\ i_{qs}^s\ i_f\ i_{dr1}^s\ i_{dr2}^s\ i_{dr3}^s\ i_{dr4}^s\ i_{qr1}^s\ i_{qr2}^s\ i_{qr3}^s\ i_{qr4}^s]^T$$

8. A method of diagnosing a turn-short fault of an induction motor, the method comprising:
   detecting a current provided to an induction motor;
   converting the current detected from the induction motor into a first reverse phase component current;
   calculating a second reverse phase component current from a virtual induction motor; and
   determining whether the induction motor has the fault by comparing the first reverse phase component current and the second reverse phase component current.

9. The method of claim 8, wherein the determining whether the induction motor has the fault includes diagnosing that the induction motor has a turn-short fault when the first reverse phase component current is a same as the second reverse phase component current.

10. The method of claim 9, further comprising:
    when the first reverse phase component current is larger than the second reverse phase component current, increasing a degree of fault of the second reverse phase component current until when the first reverse phase component current is the same as the second reverse phase component current.

11. The method of claim 8, wherein the second reverse phase component current is obtained through a dynamic model, and
    the dynamic model includes a following equatio—n.

$$V_{ITF\ model} - R_{[11\times11]} \cdot I_{ITF\ model} + \frac{d}{dt}(L_{[11\times11]} \cdot I_{ITF\ model}) \quad \text{Equation}$$

$$V_{ITF\ model} = [v_{ds}^2\ v_{qs}^s\ v_f\ v_{dr1}^s\ v_{dr2}^s\ v_{dr3}^s\ v_{dr4}^s\ v_{qr1}^s\ v_{qr2}^s\ v_{qr3}^s\ v_{qr4}^s]^T$$

$$I_{ITF\ model} = [i_{ds}^2\ i_{qs}^s\ i_f\ i_{dr1}^s\ i_{dr2}^s\ i_{dr3}^s\ i_{dr4}^s\ i_{qr1}^s\ i_{qr2}^s\ i_{qr3}^s\ i_{qr4}^s]^T$$

* * * * *